United States Patent [19]
Maldonado et al.

[11] Patent Number: 5,793,836
[45] Date of Patent: Aug. 11, 1998

[54] X-RAY MASK PELLICLE

[75] Inventors: Juan R. Maldonado; Raul E. Acosta; Marie Angelopoulos; Fuad E. Doany, all of Westchester County; Chandrasekhar Narayan, Dutchess County, all of N.Y.; Andrew T. S. Pomerene; Jane M. Shaw, both of Fairfield County, Conn.; Kurt R. Kimmel, Chittenden County, Vt.

[73] Assignees: International Business Machines Corporation, Armonk, N.Y.; Lockheed Martin Corporation, Bethesda, Md.

[21] Appl. No.: 716,657

[22] Filed: Sep. 6, 1996

[51] Int. Cl.⁶ .................................................. H05K 1/00
[52] U.S. Cl. .................................................. 378/35; 378/208
[58] Field of Search .................................. 378/34, 208, 35; 355/53

[56] References Cited

U.S. PATENT DOCUMENTS

| | | | |
|---|---|---|---|
| 4,131,363 | 12/1978 | Shea et al. | 355/75 |
| 4,198,263 | 4/1980 | Matsuda | 430/5 |
| 4,539,070 | 9/1985 | Jarocinski et al. | 430/5 |
| 4,606,803 | 8/1986 | Luthje et al. | 430/5 |
| 4,608,326 | 8/1986 | Neukermans et al. | 430/5 |
| 4,971,851 | 11/1990 | Neukermans et al. | 428/137 |

FOREIGN PATENT DOCUMENTS

| | | |
|---|---|---|
| 63-72119 | 4/1988 | Japan. |
| 1-13551 | 1/1989 | Japan. |

*Primary Examiner*—Don Wong
*Attorney, Agent, or Firm*—Whitham, Curtis & Whitham; H. Daniel Schnurmann; Mark A. Wurm

[57] ABSTRACT

An X-ray mask pellicle is capable of protecting the X-ray mask from contaminants and the wafer from contact with the X-ray absorber material of the mask. The X-ray mask pellicle is sufficiently thin to allow X-ray exposure at the required mask to wafer gaps yet is sufficiently durable, replaceable, tough and X-ray resistant to be used in X-ray lithography. A thin (organic or inorganic) X-ray mask pellicle to be placed covering the X-ray mask pattern area is fabricated as a thin film and attached to a support ring. A selected area of the pellicle film, tailored to cover the absorber pattern in the X-ray mask, is etched to decrease its thickness to below 2 μm. If the thin film of the pellicle is not itself conductive, a thin conductive film may be coated on both sides. In an alternative embodiment, the separation between the pellicle and the X-ray mask can be achieved by forming the mask with a stepped profile.

12 Claims, 8 Drawing Sheets

X-RAY MASK PELLICLE

BACKGROUND OF THE INVENTION

1. Field of the Invention

The present invention generally relates to X-ray mask pellicle assemblies used in the manufacture of semiconductor integrated circuit (IC) devices and, more particularly, to a pellicle that is placed between the X-ray mask and the wafer being exposed in a photolithiographic process and which serves to protect the X-ray mask from contaminants and the wafer from contact with the X-ray absorber material of the mask.

2. Background Description

Manufacturing of semiconductor IC devices is dependent upon the accurate replication of generated patterns onto the surface of a device substrate. The replication process is typically performed using a lithographic process followed by a variety of subtractive (etch), additive (deposition) and material modification (e.g., oxidations, ion implants, etc.) processes.

X-ray mask images are made the same size as the final images on the wafer, whereas most optical masks have images four or five times the size of the images on the wafer. Because of the one-to-one relationship of the image on an X-ray mask and the image formed on the wafer, any position errors in building the X-ray mask are replicated one for one onto the wafer. Thus, the position accuracy requirements for the fabrication of X-ray masks are very difficult to achieve and, as a result, X-ray masks are expensive to fabricate. It is therefore important to protect the X-ray masks from contaminants and mechanical damage due to scratches and the like without introducing mechanical stresses that may affect the placement accuracy.

In optical lithography, masks are formed on a quartz substrate and located some distance from the wafer to be exposed. Because particles unavoidably settle on masks, the masks are periodically cleaned. In addition, optical pellicles are used to keep settled particles outside of the depth of focus window of the stepper so that the particle is highly de-focussed and does not print. X-ray masks suffer the same exposure to foreign material particles. However, the X-ray mask structure is not easily subjected to cleaning because of the delicate nature of the membrane and the extremely tight tolerances on image size, image placement, and defect density which must be maintained because it is one power magnification technology. In addition, since the pattern on the mask is the same size as the final image to be formed on the wafer, the mask must be positioned as close as possible to the wafer during exposure. Required mask to wafer gaps are typically on the order of 5 to 40 microns. Further, for X-ray masks, depth of focus is very large so a settled particle cannot be reasonably kept outside the depth of focus window. The particle, if it is absorbant of X-ray photons, must be removed. This poses a different problem from the optical mask case because of the design and materials used in fabricating an X-ray mask. The small gap used with X-ray masks imposes further restrictions on schemes used to protect them.

An X-ray pellicle should not only protect the X-ray mask membrane from contaminants, it should also protect the wafer from contact with the absorber material in the mask. The pellicle must be durable, replaceable, tough and X-ray resistant.

SUMMARY OF THE INVENTION

It is therefore an object of the present invention to provide an X-ray mask pellicle which is capable of protecting the X-ray mask from contaminants and the wafer from contact with X-ray absorber material of the mask without compromising the lithographic performance.

It is another object of the invention to provide an X-ray mask pellicle which is sufficiently thin to allow X-ray exposure at the required mask to wafer gaps yet is sufficiently durable, replaceable, tough and X-ray resistant to be used in X-ray lithography.

According to the invention, the solution provided involves the fabrication of a thin (organic or inorganic) X-ray mask pellicle fabricated as a thin film and attached to a support ring. A commercially available film with suitable proportions may also be used for stretchable bonding to a support ring. A selected area of the pellicle film is tailored to cover the absorber pattern in the X-ray mask without contacting it by means of a stepped film. This may be achieved by etching the pellicle film to decrease its thickness to below 2 μm or by a second film located below the region of the pellicle not covering the mask absorber pattern. If the thin film of the pellicle is not itself conductive, a thin conductive film may be coated on both sides. The pellicle structure fits between the mask and the wafer allowing X-ray exposure at the required mask to wafer gaps. The protective film which constitutes the X-ray mask pellicle does not contact the X-ray mask absorber pattern and, therefore, does not cause distortions due to contact stresses.

In an alternative embodiment, the pellicle overlies a stepped X-ray membrane mask, which is formed on a support silicon substrate. This structure is, in turn, supported by glass support ring. A backside pellicle film on a silicon support frame can optionally be glued to the inner diameter of the support ring in both embodiments, but the front side pellicle must be spaced sufficiently away from the X-ray membrane so as not to touch the patterned X-ray absorber material. In the first embodiment, this is accomplished by a stepped structure of the pellicle film or composite film, whereas in the second embodiment, the X-ray membrane is stepped.

The invention solves several problems in X-ray lithographic manufacture of semiconductor ICs. First, the X-ray mask absorber is protected from direct contact to external sources of possible damage (e.g., scratches). Second, the X-ray mask is protected from dust or debris particles which might otherwise become imbedded in the absorber pattern. Third, the X-ray mask pellicle prevents contamination of the stepper and wafer by the absorber metal debris in the event of catastrophic breakage of the mask membrane. Fourth, the X-ray mask pellicle prevents contamination of the absorber pattern by debris generated by the resist or the stepper environment during X-ray exposure from reaching the resist on the wafer. The contribution of these photoelectrons to the total exposure may affect the ultimate resolution of the X-ray lithographic system.

BRIEF DESCRIPTION OF THE DRAWINGS

The foregoing and other objects, aspect and advantages will be better understood from the following detailed description of a preferred embodiment of the invention with reference to the drawings.in which.

3

DETAILED DESCRIPTION OF PREFERRED EMBODIMENTS OF THE INVENTION

Figure 1:
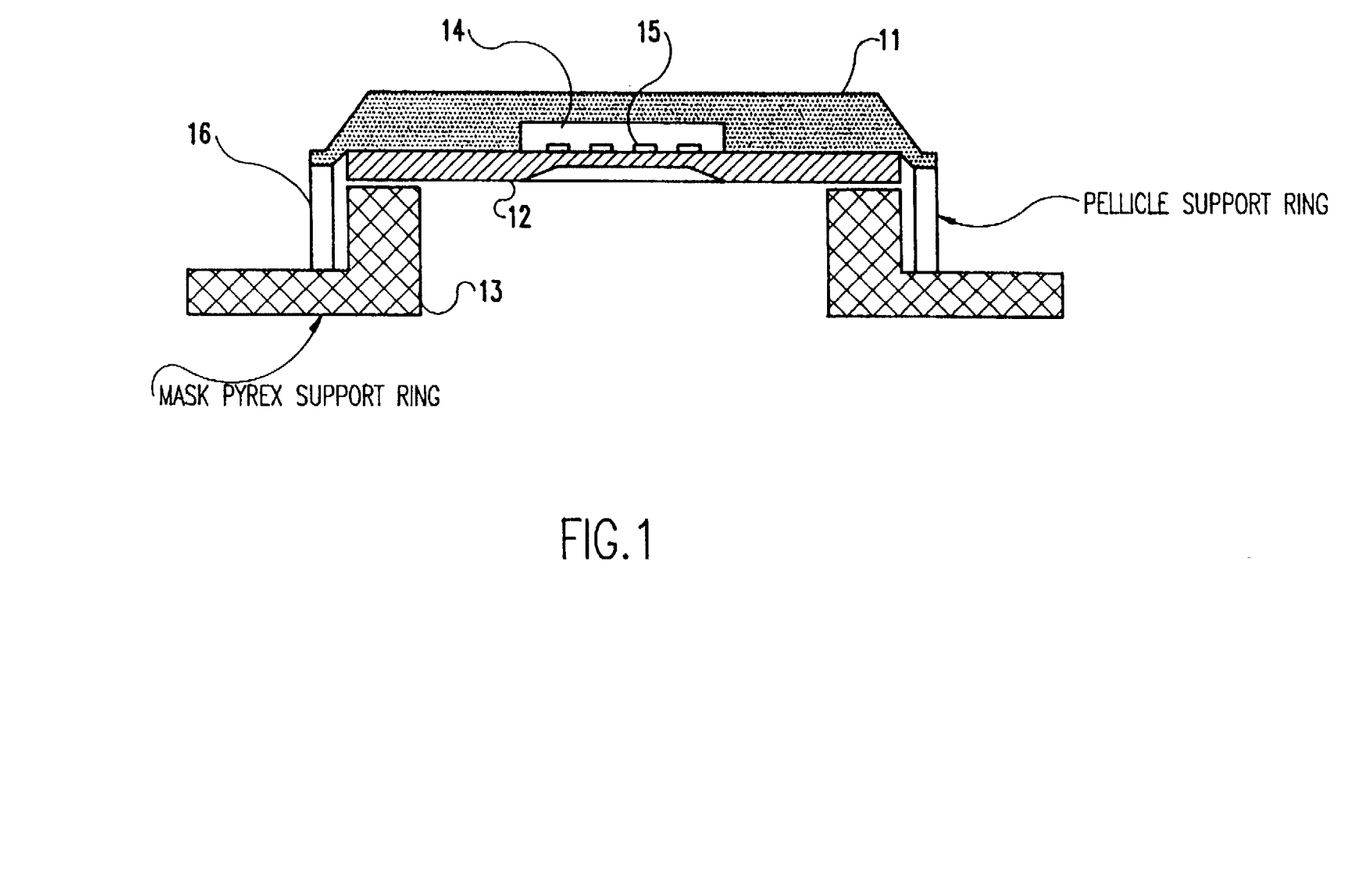
FIG. 1 is a cross-sectional view of an X-ray mask pellicle assemble according to a first preferred embodiment of the invention.

Referring now to the drawings, and more particularly to FIG. 1, there is shown an X-ray mask pellicle according to the invention. The pellicle 11 overlies an X-ray membrane mask 12, which in turn is supported by a support ring 13. The support ring 13 may be made of a glass material known under the tradename "Pyrex". The pellicle 1 is provided with an indentation or step 14 deep enough to prevent contact with the absorber pattern 15, typically made of a heavy metal (e.g., Au, W, Ta) or alloys of heavy metals formed by evaporation, electroplating or sputtering and etching techniques on X-ray mask 12. The pellicle 11 may be coated on both sides with a thin (<100Å) aluminum film to reduce charging and possibly radiation damage effects during X-ray exposure. The pellicle itself is mounted on a frame 16 and secured to the X-ray mask support ring 13. The thickness of the pellicle in the X-ray transparent area is chosen to minimize X-ray absorption while maintaining adequate mechanical strength in the film structure. An additional pellicle (not shown) mounted on a smaller diameter frame may be placed inside the mask support ring 13 to cover the back of the membrane area.

Figure 2:
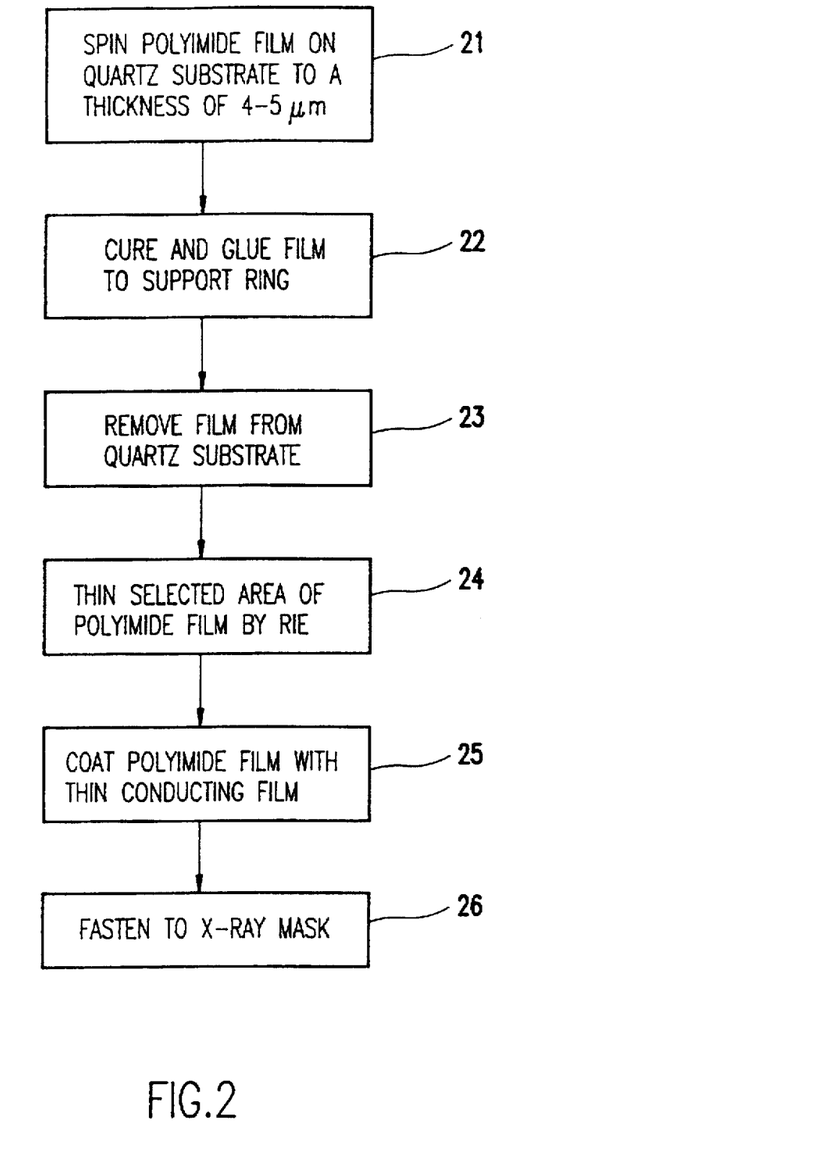
FIG. 2 is a flow diagram illustrating a process for the fabrication of the X-ray mask pellicle shown in FIG. 1 according to the invention.
Figure 3A:
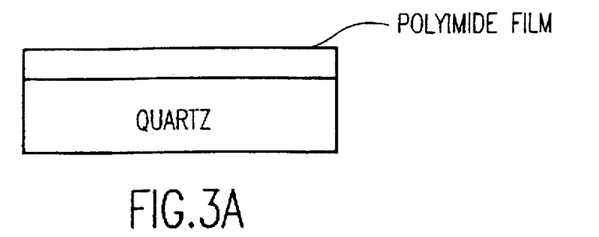
FIG. 3A to 3D are cross-sectional views showing the stages of fabrication according to the process of FIG. 2.
Figure 3B:
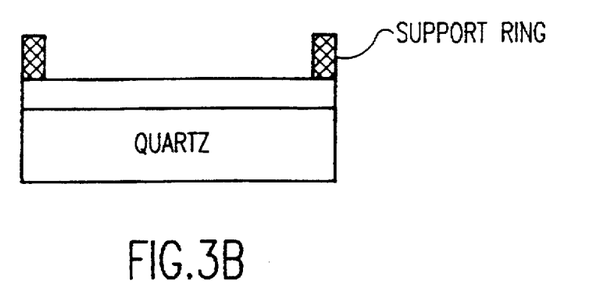
Figure 3C:
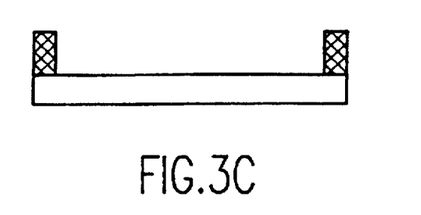
Figure 3D:
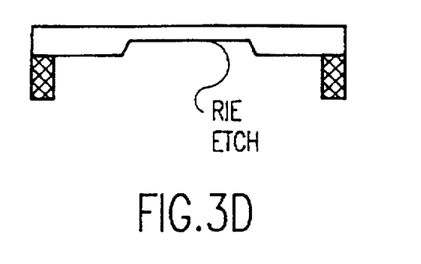

The fabrication steps that may be utilized in a first preferred embodiment of the invention as shown in FIG. 1 are illustrated in the flow diagram of FIG. 2. In the first step, shown in function block 21, a 4 to 5 μm polyimide film is spun on a large area quartz substrate. This structure is shown in FIG. 3A. After proper curing, the polyimide film is glued to a support ring in function block 22, as shown in FIG. 3B. Subsequently, the polyimide film is removed from the substrate utilizing ultraviolet (UV) laser ablation in function block 23, as shown in FIG. 3C. This is accomplished by scanning from the back (not coated) side of the quartz substrate with a relatively large laser beam focused at the polyimide/quartz interface. Gases developed at the interface disconnect the film from the quartz substrate. A selected area of the polyimide film (from the side not previously in contact with the quartz substrate) is reactive ion etched (RIE) in function block 24 to provide a step in the polyimide film corresponding to the step 14 shown in FIG. 1. This structure is shown in FIG. 3D. The thinned area of the polyimide film must satisfy the X-ray transmission requirements. The selected area is tailored to cover the absorber pattern in the X-ray mask. The polyimide film is coated on both sides with a thin conductive film in function block 25. This film (e.g., <100Å of aluminum or a conductive organic film) has a relatively high X-ray transparency. Finally, the complete pellicle structure is fastened to the X-ray mask in function block 26.

If a higher optical transparency in the alignment areas is required, the polyimide may be selectively thinned by RIE or it may be removed completely with a laser beam in the alignment areas.

4

Figure 4:
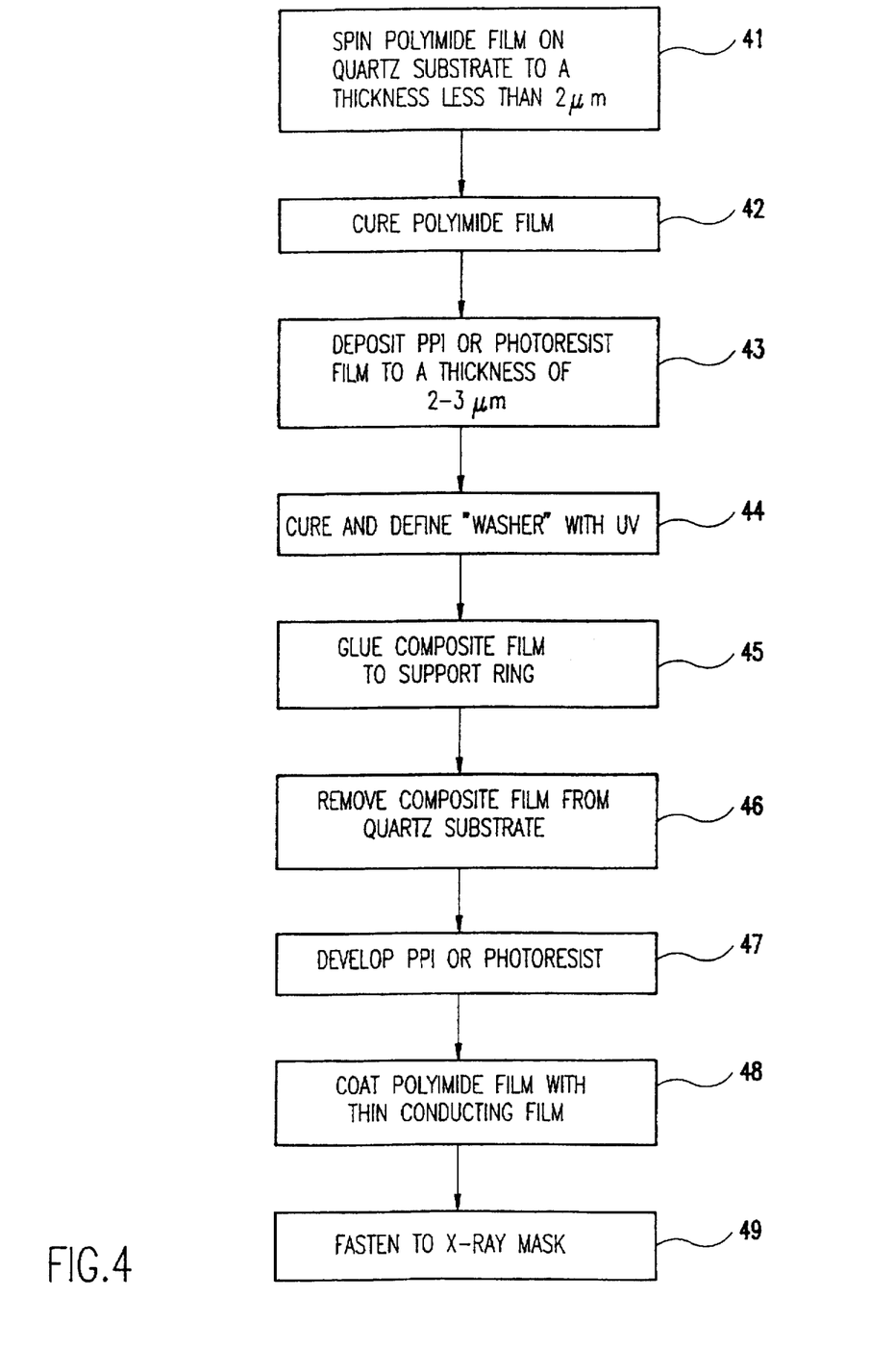
FIG. 4 is a flow diagram illustrating an alternative process for the fabrication of the X-ray mask pellicle shown in FIG. 1 according to the invention.
Figure 5A:
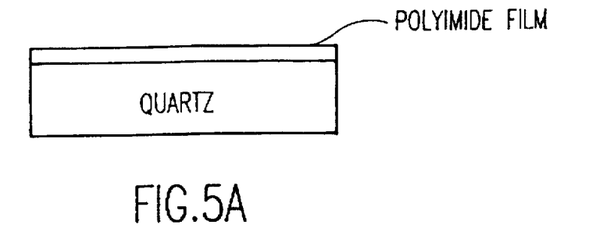
FIGS. 5A to 5E are cross-sectional views showing the stages of fabrication according to the process of FIG. 4.
Figure 5B:
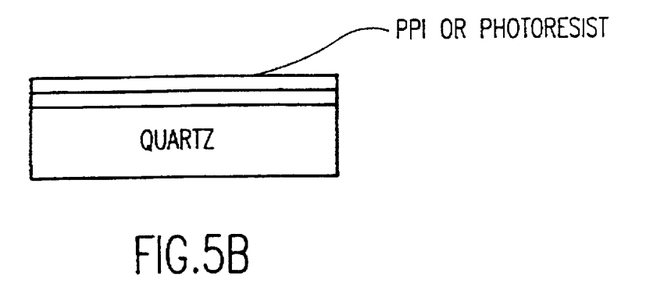
Figure 5C:
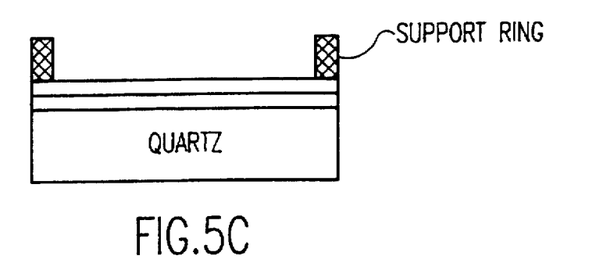
Figure 5D:
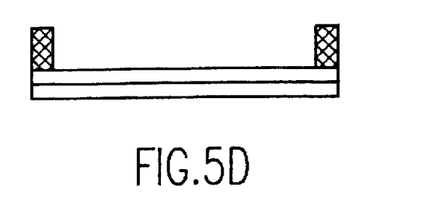
Figure 5E:
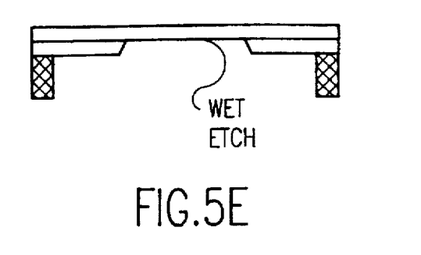

FIG. 4 shows an alternative process for the manufacture of the pellicle assembly of FIG. 1. Whereas a reactive ion etch (RIE) was used in the process according to FIG. 2, the alternative process of FIG. 4 uses a wet etch to thin the pellicle film. In the first step, shown in function block 41, a polyimide film is spun on a quartz substrate to a thickness less than 2 Mm thick. The spun polyimide film is cured in function block 42 to produce the structure shown in FIG. 5A. Next, in function block 43 a photosensitive polyimide (PPI) film or a photoresist film is deposited to a thickness of between 2 and 3 Mm to produce the structure shown in FIG. 5B. In function block 44 the PPI or photoresist film is cured and exposed with ultraviolet (UV) light to define a "washer" or annular ring. The film is then glued to a supporting ring in function block 45 to produce the structure shown in FIG. 5C. The films are then removed from the quartz substrate in function block 46, in a manner substantially as described above, to produce the ring supported films shown in FIG. 5D. The exposed PPI or photoresist is developed in function block 47 resulting in the structure shown in FIG. 5E. The composite film is coated on both sides with a thin conductive film in function block 48. Finally, the complete pellicle structure is fastened to the X-ray mask in function block 49.

It is possible to utilize other than laser techniques to fabricate the pellicle films. In particular, free standing polyimide films may be obtained by submerging in water after the curing step of the films spun on substrates. This process takes advantage of the hygroscopic properties of the polyimide films.

Figure 6:
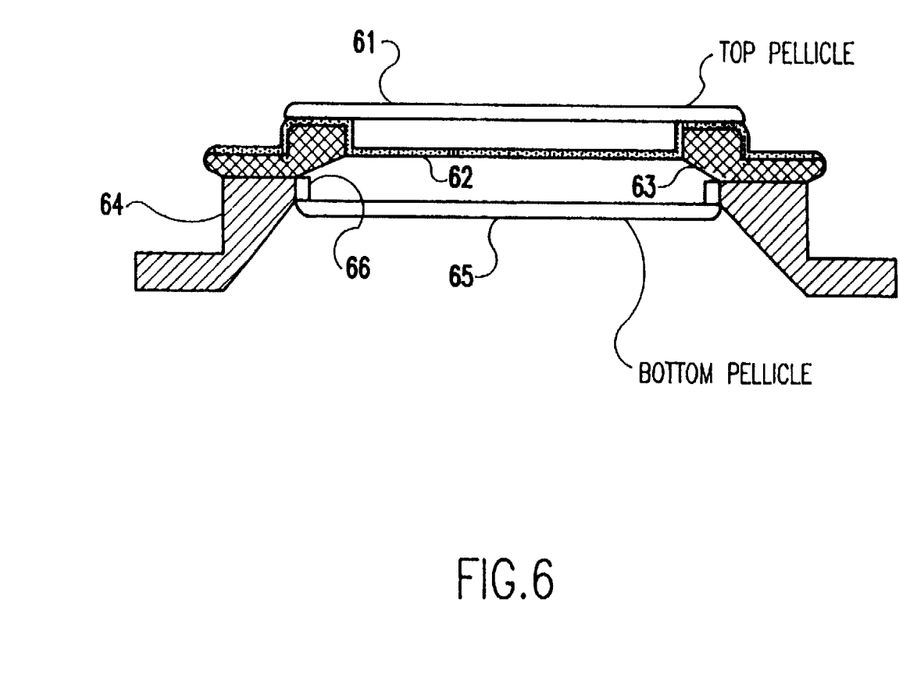
FIG. 6 is a cross-sectional view of an X-ray mask pellicle assembly according to a second preferred embodiment of the invention.

FIG. 6 shows in alternative X-ray mask pellicle structure. The pellicle 61 overlies an X-ray membrane mask 62, which is formed on support ring 63 of silicon. This structure is, in turn, supported by glass support ring 64. A backside pellicle film 65 on a silicon support frame 66 can optionally be glued to the inner diameter of the support ring 64. Note that a backside pellicle could also be used in the structure shown in FIG. 1. The application of a backside pellicle is relatively straight forward in both embodiments but, as in the FIG. 1 embodiment, the frontside pellicle must be spaced sufficiently away from the X-ray membrane so as not to touch the patterned X-ray absorber material. In the FIG. 1 embodiment, this is accomplished by a stepped structure of the pellicle film or composite film. In the embodiment shown in FIG. 6, the X-ray membrane is stepped.

Figure 7:
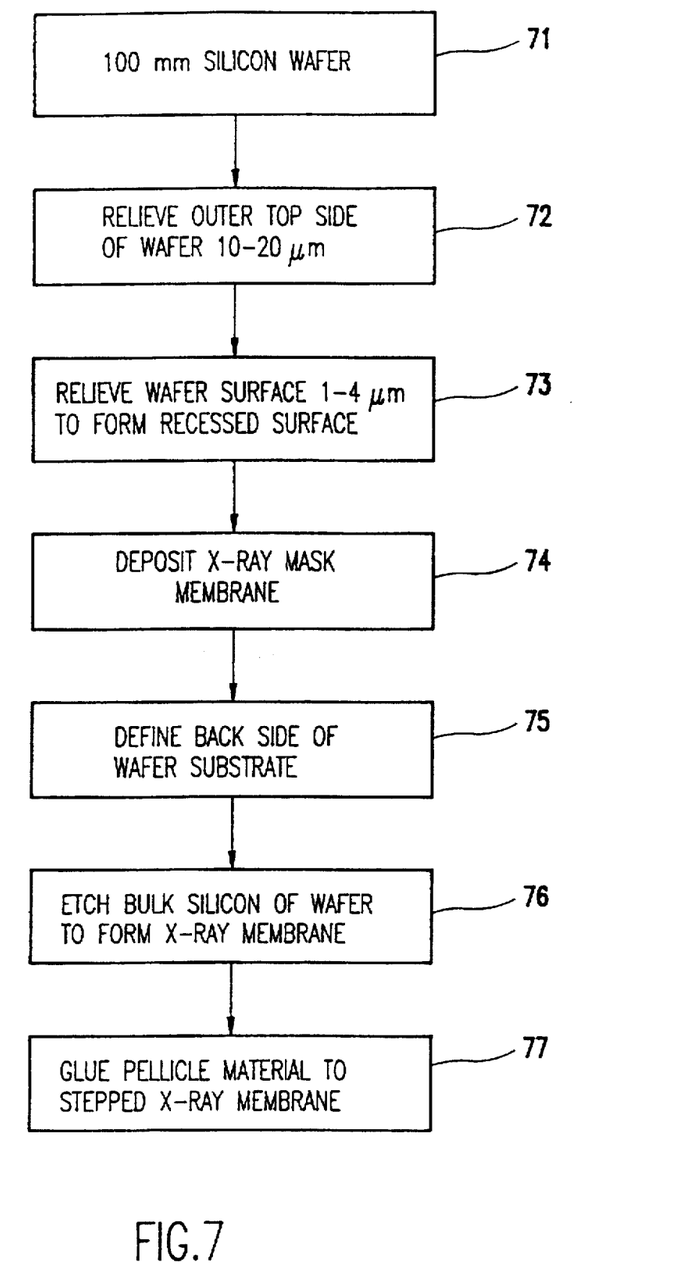
FIG. 7 is a flow diagram illustrating a process for the fabrication of the X-ray mask pellicle shown in FIG. 6.
Figure 8A:
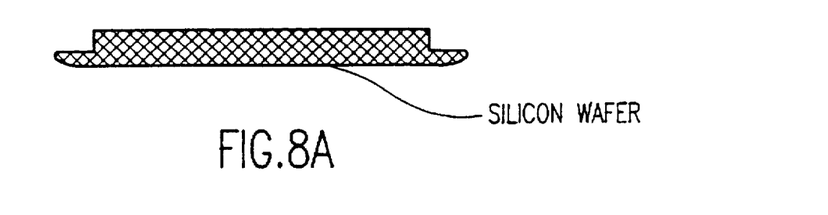
FIGS. 8A to 8D are cross-sectional views showing the stages of fabrication according to the process of FIG. 7.
Figure 8B:
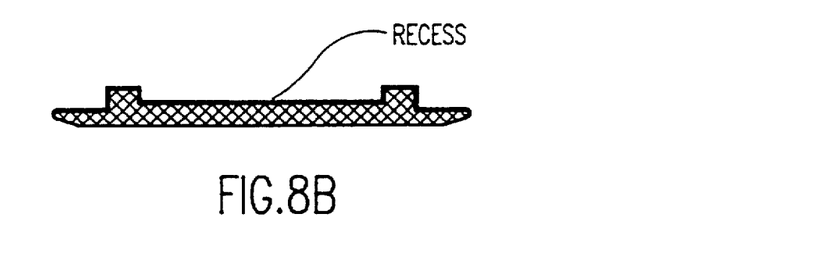
Figure 8C:
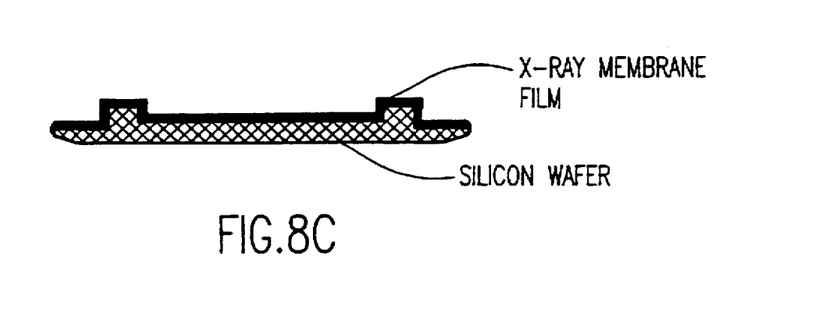
Figure 8D:
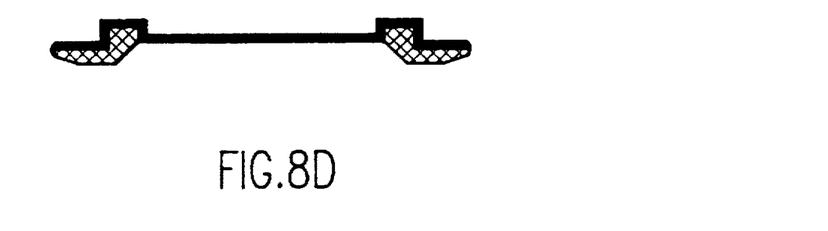

FIG. 7 illustrates a process for producing the structure shown in FIG. 6. The process begins in function block 71 with a 100 mm silicon wafer substrate. Using lithographic and etch steps or by grinding, the outer topside surface 10 to 20 μm outside the eventual membrane area is relieved to form a recessed surface in function block 72. This produces the structure shown in FIG. 8A. Using the same techniques, the wafer surface is relieved 1 to 4 pm deep in function block 73 to form a recessed surface, as shown in FIG. 8B. An X-ray mask membrane is then deposited or formed over the silicon wafer substrate in function block 74. This membrane conforms to the recessed surface as shown in FIG. 8C. The X-ray mask material may be an inorganic film of silicon dioxide, boron nitride, amorphous carbon, silicon carbide and diamond. A boron doped silicon membrane may also be obtained. A preferred material for the X-ray mask material is silicon carbide. Next, using standard lithographic processes, the membrane size and shape is defined on the back side of the wafer substrate in function block 75. The bulk silicon is etched through in function block 76 to form the membrane, as shown in FIG. 8D. The mask structure is now in a form to accept the pellicle on the front side in function block 77. The pellicle material is glued directly to the surface with the pellicle support frame facing up.

Radiation damage in X-ray masks is an issue when it causes distortion of the absorber pattern. In the present invention, some level of radiation damage is allowable to the pellicle structure because the pellicle is not in direct contact with the absorber pattern. Polyimide is a candidate for pellicle material because it can withstand relatively high X-ray doses without catastrophic mechanical damage. The X-ray mask pellicle may be easily removed and replaced after a predetermined time period. Other organic films with high radiation resistance may also be used.

Other possibilities for pellicle material include inorganic films like silicon nitride, boron nitride, amorphous carbon, silicon carbide and diamond. Inorganic materials can inherently withstand larger radiation doses than polymers.

While the invention has been described in terms of preferred embodiments, those skilled in the art will recognize that the invention can be practiced with modification within the spirit and scope of the appended claims.

Having thus described our invention, what we claim as new and desire to secure by Letters Patent is as follows:

1. An X-ray mask pellicle for protecting an X-ray mask used in one power magnification lithographic reproducing of electronic devices comprising:
   a film which is sufficiently thin to allow X-ray exposure at a required mask to wafer gap yet is sufficiently durable, replaceable, tough and X-ray resistant to be used in X-ray lithography, said film being separated from an X-ray mask a distance sufficient to avoid contact with an absorber pattern in the X-ray mask;
   a pellicle support on which the film is attached allowing replaceable mounting of the X-ray mask pellicle over an X-ray mask; and
   a support ring on which the X-ray mask, X-ray pellicle support and X-ray mask pellicle are attached.

2. The X-ray mask pellicle as recited in claim 1 wherein said film is thinner in an area tailored to cover the absorber pattern than immediately adjacent said area, said film having a stepped cross-section at the perimeter of said area.

3. The X-ray mask pellicle as recited in claim 2 wherein said film is a single film which is thinned partially or totally in said area by etching.

4. The X-ray mask pellicle as recited in claim 1 wherein said film is an inorganic film.

5. The X-ray mask pellicle recited in claim 1 the X-ray mask is stepped and the film is applied over said stepped X-ray mask.

6. The X-ray mask pellicle recited in claim 5 wherein said stepped X-ray mask is formed over a substrate.

7. The X-ray mask pellicle recited in claim 1 further comprising a bottom pellicle attached to said support ring for protecting an underside of said X-ray mask.

8. An X-ray mask pellicle for protecting an X-ray mask used in one power magnification lithographic reproducing of electronic devices comprising:
   a film which is sufficiently thin to allow X-ray exposure at a required mask to wafer gap yet is sufficiently durable, replaceable, tough and X-ray resistant to be used in X-ray lithography, said film being a polyimide film coated with a thin conductive film having a relatively high X-ray transparency and separated from an X-ray mask a distance sufficient to avoid contact with an absorber pattern in the X-ray mask, said film being etched to be thinner in an area tailored to cover the absorber pattern than immediately adjacent said area, said film having a stepped cross-section at the perimeter of said area;
   a pellicle support on which the film is attached allowing replaceable mounting of the X-ray mask pellicle over an X-ray mask; and
   a support ring on which the X-ray mask, X-ray pellicle support and X-ray mask pellicle are attached.

9. The X-ray mask pellicle as recited in claim 8 wherein said thin conductive film is aluminum having a thickness <100 Å.

10. An X-ray mask pellicle for protecting an X-ray mask used in one power magnification lithographic reproducing of electronic devices comprising:
    a film which is sufficiently thin to allow X-ray exposure at a required mask to wafer gap yet is sufficiently durable, replaceable, tough and X-ray resistant to be used in X-ray lithography, said film being a composite film comprising a first thin film and a second etched film and separated from an X-ray mask a distance sufficient to avoid contact with an absorber pattern in the X-ray mask, said second film being etched partially or totally in an area tailored to cover the absorber pattern, said film having a stepped cross-section at the perimeter of said area;
    a pellicle support on which the film is attached allowing replaceable mounting of the X-ray mask pellicle over an X-ray mask; and
    a support ring on which the X-ray mask, X-ray pellicle support and X-ray mask pellicle are attached.

11. The X-ray mask pellicle as recited in claim 10 wherein said first film is a polyimide film and said second film is photosensitive film, said composite film after said second film has been etched being coated with a thin conductive film having a relatively high X-ray transparency.

12. The X-ray mask pellicle as recited in claim 11 wherein said thin conductive film is aluminum having a thickness <100 Å.

* * * * *